(12) United States Patent
Wu

(10) Patent No.: US 8,928,378 B2
(45) Date of Patent: Jan. 6, 2015

(54) SCAN/SCAN ENABLE D FLIP-FLOP

(75) Inventor: Miaosong Wu, Shanghai (CN)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 666 days.

(21) Appl. No.: 12/771,157

(22) Filed: Apr. 30, 2010

(65) Prior Publication Data

US 2011/0234283 A1     Sep. 29, 2011

(30) Foreign Application Priority Data

Mar. 24, 2010   (CN) .......................... 2010 1 0132578

(51) Int. Cl.
*H03K 3/289* (2006.01)
*H03K 3/037* (2006.01)
*G01R 31/3185* (2006.01)

(52) U.S. Cl.
CPC ............ *H03K 3/0375* (2013.01); *H03K 3/0372* (2013.01); *G01R 31/318541* (2013.01)
USPC ....................................................... 327/202

(58) Field of Classification Search
USPC .................. 327/199–203, 208, 210–215, 218
See application file for complete search history.

(56) References Cited

U.S. PATENT DOCUMENTS

| | | | | |
|---|---|---|---|---|
| 4,349,753 A * | 9/1982 | Scavuzzo | ...................... | 327/204 |
| 5,329,178 A * | 7/1994 | Burton | ............. | 326/39 |
| 5,617,428 A * | 4/1997 | Andoh | .......... | 714/726 |
| 5,717,700 A * | 2/1998 | Crouch et al. | ............... | 714/726 |
| 5,867,049 A | 2/1999 | Mohd | | |
| 7,583,121 B2 * | 9/2009 | Berzins et al. | ................ | 327/202 |
| 7,596,732 B2 * | 9/2009 | Branch et al. | ................ | 714/726 |
| 2009/0237136 A1 | 9/2009 | Kim | | |

OTHER PUBLICATIONS

Webster's College Dictionary, 2000, 3 pages, Random House, New York.

* cited by examiner

*Primary Examiner* — Sibin Chen

(74) *Attorney, Agent, or Firm* — Slater & Matsil, L.L.P.

(57) ABSTRACT

In accordance with an embodiment, an integrated circuit comprises a master-slave flip-flop, a selection logic circuit, and a pass structure. The selection logic circuit is configured to selectively enable or disable one or more clock signals. The pass structure is configured to pass a data signal to the master-slave flip-flop in response to a selected clock signal being enabled.

17 Claims, 4 Drawing Sheets

SCAN/SCAN ENABLE D FLIP-FLOP

This application claims priority to Chinese Patent Application No. 201010132578.4, which was filed Mar. 24, 2010 and is incorporated herein by reference.

TECHNICAL FIELD

The disclosure relates generally to an integrated circuit and a method of operating the circuit and, more particularly, to a scan/scan enable D flip-flop and method for operating the flip-flop.

BACKGROUND

Generally, scan/scan enable D flip-flops are widely used integrated circuits in the semiconductor industry. One use of these flip-flops may be for testing devices in a semiconductor chip. For example, the scan/scan enable D flip-flop may receive a scan input so as to test a logic circuit in the chip.

Scan/scan enable D flip-flops generally have a circuit interposed on data signal paths for selectively choosing which signal is input into the flip-flop. For example, a multiplexer may be present in the data path to selectively output a data signal, a feedback signal, or a scan input signal. However, such a circuit may cause a latency delay in the output of the circuit, which is input into the flip-flop master-slave circuit, such that the set-up time for the chosen signal is generally larger than necessary if such circuit was not present. A large set-up time may cause difficulty in the design of the integrate circuit because synchronization of appropriate signals may be difficult. Further, a large set-up time may degrade the scan/scan enable D flip-flop's performance and, thereby, degrade the standard cell library.

A smaller set-up time may make chip design simpler because a designer would not need to create a delay in some signals to synchronize the signals input into a scan/scan enable D flip-flop. Accordingly, there is a need in the art for a scan/scan enable flip-flop with a smaller set-up time to decrease complexity in integrated circuit design and to improve performance.

SUMMARY

In accordance with an embodiment, an integrated circuit comprises a master-slave flip-flop, a selection logic circuit, and a pass structure. The selection logic circuit is configured to selectively enable or disable one or more clock signals. The pass structure is configured to pass a data signal to the master-slave flip-flop in response to a selected clock signal being enabled.

In accordance with another embodiment, an integrated circuit comprises a selection logic circuit in a clock path and a pass structure in a data path. The selection logic circuit is operable to receive a clock signal and a control signal, and is operable to selectively output an enabled clock signal and a disabled clock signal in response to the control signal. The pass structure is operable to selectively pass a first data signal or a second data signal in response to the enabled clock signal and the disabled clock signal.

In accordance with a further embodiment, a method of operating an integrated circuit comprises receiving a control signal at a selection logic circuit, selectively enabling or disabling one or more clock signals in response to the control signal, passing a data signal in response to a selected clock signal being enabled, and storing the data signal that is passed.

BRIEF DESCRIPTION OF THE DRAWINGS

For a more complete understanding of embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the disclosure provides many applicable inventive concepts that can be embodied in a wide variety of specific contexts. The specific embodiments discussed are merely illustrative of specific ways to make and use the invention, and do not limit the scope.

An embodiment will be described in a specific context, namely an integrated circuit for a scan/scan enable D flip-flop. Other embodiments may also be applied wherever selection logic is used to selectively alter a circuit's operation.

Figure 1A:
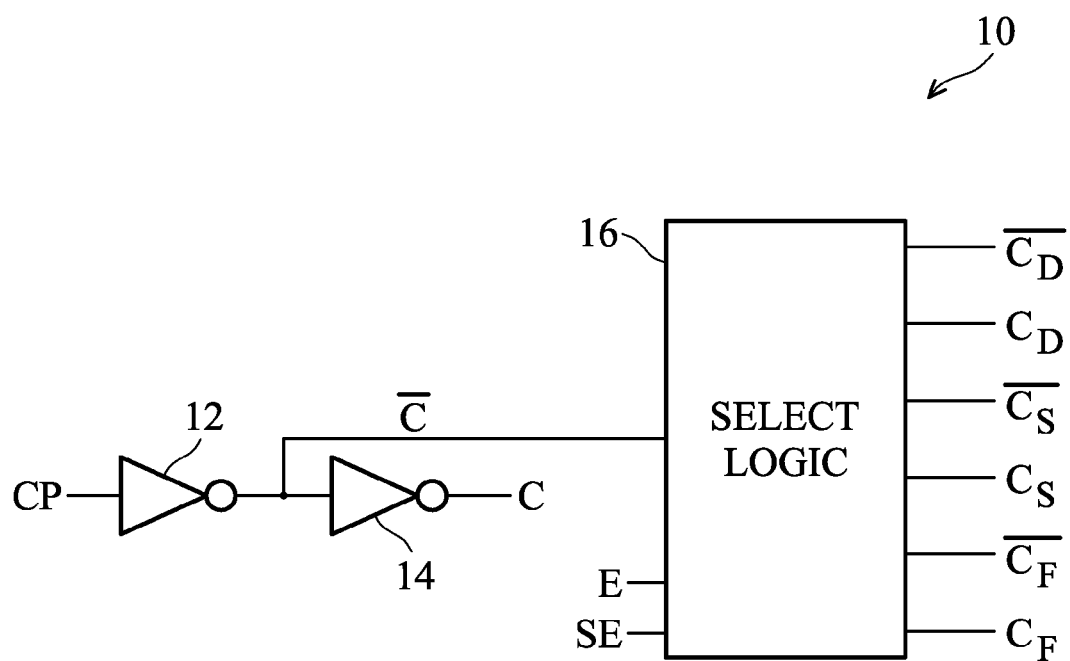
FIG. 1A is a clock path with inline selection logic in accordance with an embodiment.
Figure 1B:
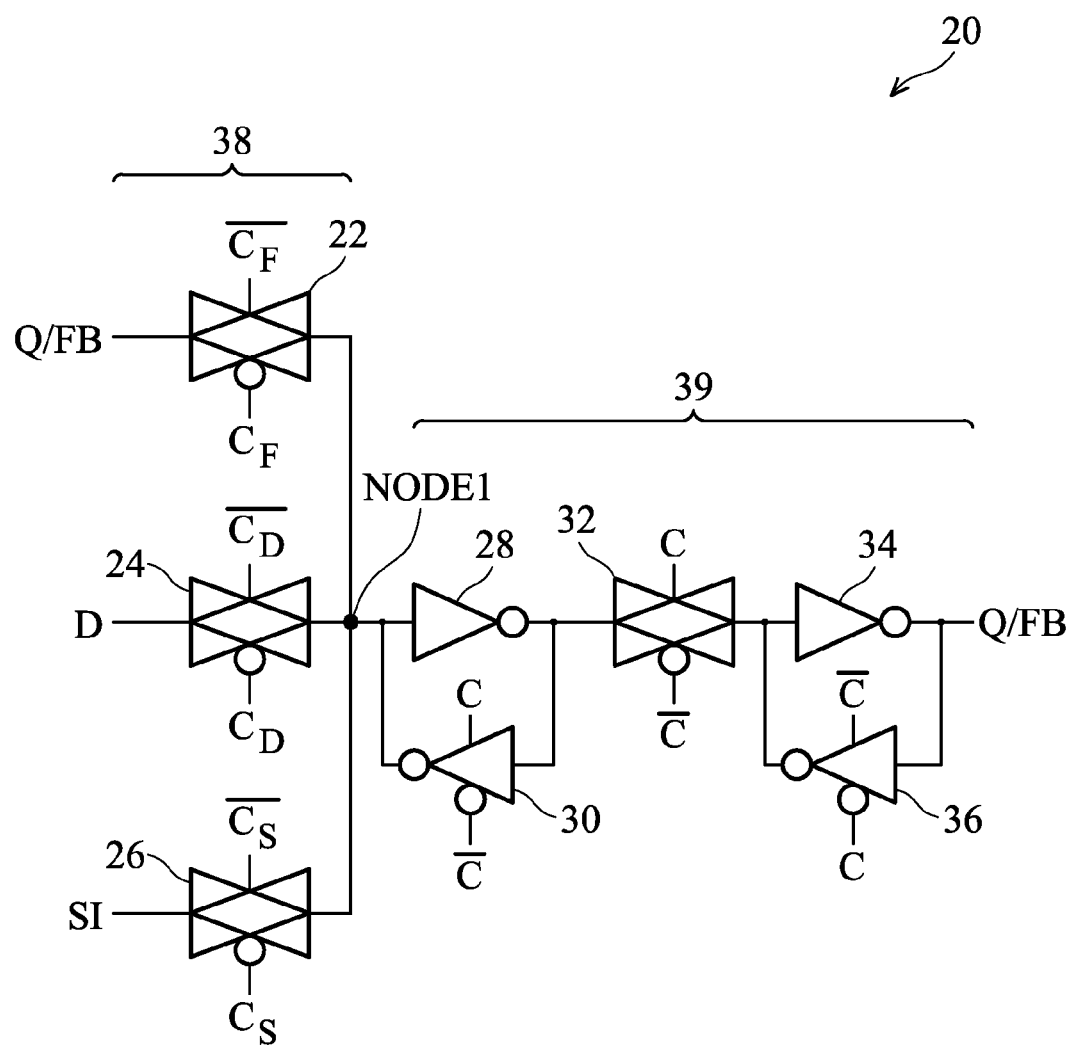
FIG. 1B is a data path utilizing the clock signals from the clock path in accordance with an embodiment.

FIGS. 1A and 1B each illustrate portions of a scan/scan enable D flip-flop in accordance with an embodiment. FIG. 1A shows a clock path 10 with inline selection logic 16. The clock path 10 comprises an input clock signal CP input into inverter 12. The output of the inverter 12 is the inverse clock signal $\overline{C}$ for the D flip-flop and is electrically coupled to an input of the selection logic 16 and to an input of inverter 14. The output of inverter 14 is the clock signal C. A scan enable signal SE and an enable signal E are input into the selection logic 16. The selection logic 16 outputs a data clock signal $C_D$, an inverse data clock signal $\overline{C_D}$, a scan clock signal $C_S$, an inverse scan clock signal $\overline{C_S}$, a feedback clock signal $C_F$, and an inverse feedback clock signal $\overline{C_F}$.

FIG. 1B depicts a data path 20 utilizing the clock signals from the clock path 10 in FIG. 1A. The data path 20 comprises a pass structure 38 and a master-slave flip-flop 39. The pass structure 38 comprises transmission gates 22, 24, and 26. Transmission gate 22 has an input coupled to an output/feedback signal Q/FB, an NMOS control node coupled to inverse feedback clock signal $\overline{C_F}$, a PMOS control node coupled to feedback clock signal $C_F$, and an output coupled to a first node NODE1. Transmission gate 24 has an input coupled to a data signal D, an NMOS control node coupled to inverse data clock signal $\overline{C_D}$, a PMOS control node coupled to data clock signal $C_D$, and an output coupled to the first node NODE1. Transmission gate 26 has an input coupled to an scan input signal SI, an NMOS control node coupled to inverse scan clock signal $\overline{C_S}$, a PMOS control node coupled to scan clock signal $C_S$, and an output coupled to the first node NODE1.

The master-slave flip-flop 39 comprises inverters 28 and 34, clock gating inverters 30 and 36, and a transmission gate 32. The input of the inverter 28 is coupled to the first node NODE1 and to the output of the clock gating inverter 30. The output of the inverter 28 is coupled to an input of the transmission gate 32 and to the input of the clock gating inverter 30. The clock gating inverter 30 has an NMOS control node coupled to the clock signal C and has a PMOS control node coupled to the inverse clock signal $\overline{C}$. The transmission gate 32 has an NMOS control node coupled to the clock signal C and has a PMOS control node coupled to the inverse clock signal $\overline{C}$. The output of the transmission gate 32 is coupled to an input of the inverter 34, which is also coupled to an output of the clock gating inverter 36. The output of the inverter 34 is the output/feedback signal Q/FB and is coupled to the input of the clock gating inverter 36. The clock gating inverter 36 has an NMOS control node coupled to the inverse clock signal $\overline{C}$ and has a PMOS control node coupled to the clock signal C. The master-slave flip-flop 39 may comprise a set function, a clear function, or a combination thereof.

Figure 2:
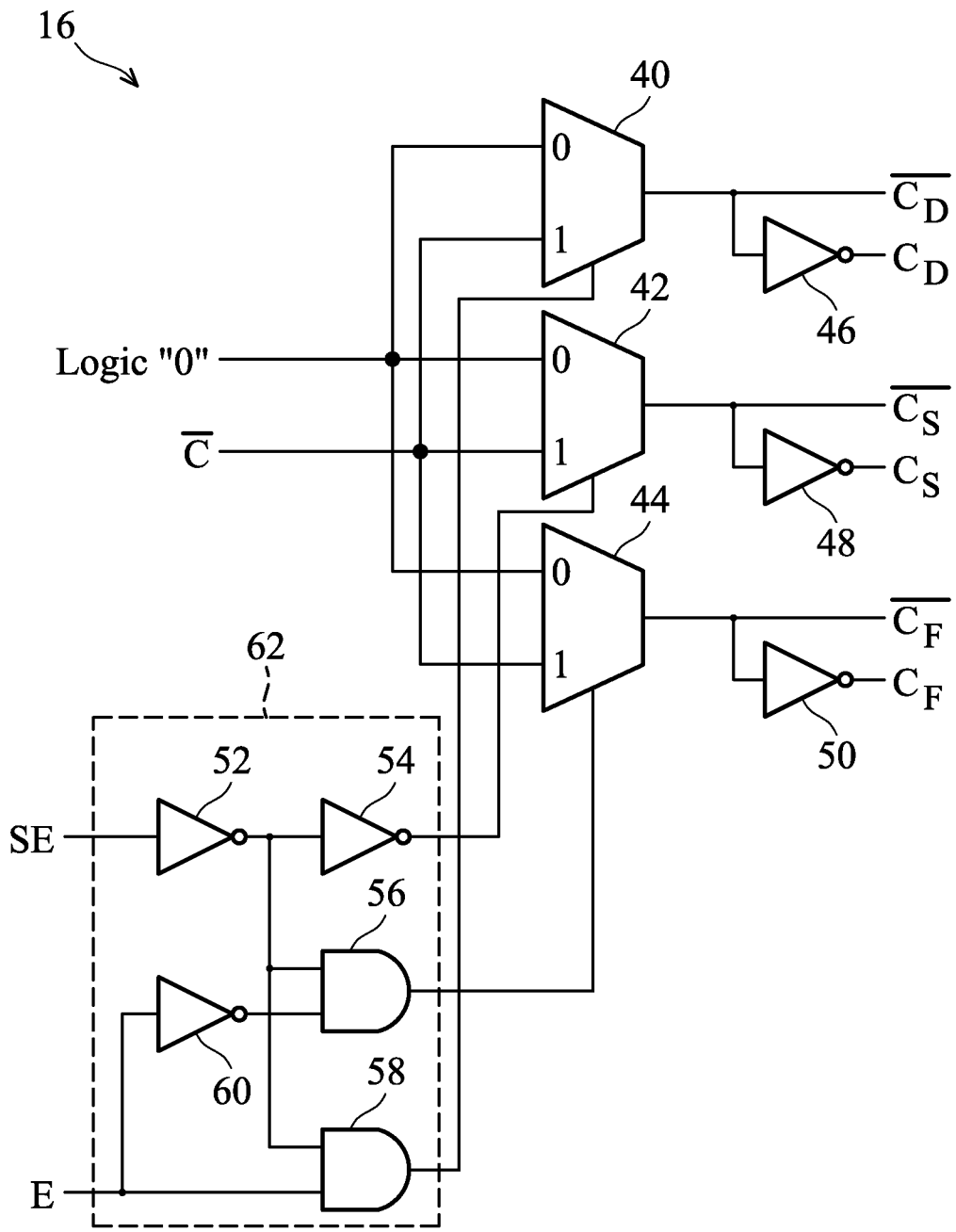
FIG. 2 is an exemplary selection logic circuit in accordance with an embodiment.

FIG. 2 illustrates an exemplary selection logic circuit 16 that may be part of the clock path 10 in FIG. 1A. The selection logic 16 comprises a decode circuit 62. The decode circuit 62 has an inverter 52 with the scan enable signal SE input into it. The output of the inverter 52 is coupled to the input of another inverter 54, to an input of an AND gate 56, and to an input of another AND gate 58. The decode circuit 62 also comprises an inverter 60 with the enable signal E input into it. The output of the inverter 60 is coupled to another input of the AND gate 56. The enable signal E is also coupled to an input of the AND gate 58. The output of the AND gate 58 is coupled to a control input of a clock control multiplexer 40 for the data clock signal $C_D$. The output of the inverter 54 is coupled to a control input of a clock control multiplexer 42 for the scan clock signal $C_S$. The output of the AND gate 56 is coupled to a control input of a clock control multiplexer 44 for the feedback clock signal $C_F$. Each clock control multiplexer 40, 42, and 44 has an input coupled to a low voltage, or a logic "0", and another input coupled to the inverse clock signal $\overline{C}$. The clock control multiplexers 40, 42, and 44 are arranged such that when the control input signal for each respective multiplexer is a high voltage, or a logic "1", the output of the multiplexer is the inverse clock signal $\overline{C}$ such that the output signal is enabled, and when the control input signal is a low voltage, or a logic "0", the output of the multiplexer is a low voltage, or the logic "0", signal such that the signal output is disabled.

The output of the clock control multiplexer 40 is inverse data clock signal $\overline{C_D}$, which is also coupled to the input of an inverter 46. The output of inverter 46 is the data clock signal $C_D$. The output of the clock control multiplexer 42 is inverse scan clock signal $\overline{C_S}$, which is also coupled to the input of an inverter 48. The output of inverter 48 is the scan clock signal $C_S$. Similarly, The output of the clock control multiplexer 44 is inverse feedback clock signal $\overline{C_F}$, which is also coupled to the input of an inverter 50. The output of inverter 50 is the feedback clock signal $C_F$.

The selection logic 16 illustrate in FIG. 2 therefore generally satisfies the conditions indicated in the truth table labeled as Table 1, below. Persons having ordinary skill in the art may easily alter or modify the circuit in FIG. 2 and still generally satisfy the conditions of Table 1. Accordingly, any circuits that generally satisfy Table 1 are considered within the scope of embodiments.

TABLE 1

| Inputs | | Outputs | | | | | |
| --- | --- | --- | --- | --- | --- | --- | --- |
| SE | E | $\overline{C_D}$ | $C_D$ | $\overline{C_S}$ | $C_S$ | $\overline{C_F}$ | $C_F$ |
| 0 | 0 | 0 | 1 | 0 | 1 | $\overline{C}$ | C |
| 0 | 1 | $\overline{C}$ | C | 0 | 1 | 0 | 1 |
| 1 | x | 0 | 1 | $\overline{C}$ | C | 0 | 1 |

The operation of the system as illustrated in FIGS. 1A, 1B, and 2 may be readily understood by a person having ordinary skill in the art, but the operation will be described herein to fully articulate its functionality. The system has three general operations. A first operation is when the scan enable signal SE and the enable signal E are both at a low voltage, or a logic "0". In this state, the output of the AND gate 56 is a high voltage, or a logic "1". The outputs of the inverter 54 and the AND gate 58 are both a low voltage, or a logic "0". With these outputs input into the clock control multiplexers 40, 42, and 44, both the clock control multiplexers 40 and 42 output a low voltage, or logic "0", as the inverse data clock signal $\overline{C_D}$ and the inverse scan clock signal $\overline{C_S}$, respectively. Thus, the data clock signal $C_D$ and the scan clock signal $C_S$ are both at a high voltage, or a logic "1". However, with the logic "1" output from the AND gate 56 and input into the control input of clock control multiplexer 44, the clock control multiplexer 44 outputs the inverse clock signal $\overline{C}$ as the inverse feedback clock signal $\overline{C_F}$, and thus, the feedback clock signal $C_F$ is the clock signal C.

These clock signals are then input into the control inputs of transmission gates in the data path 20. With the inverse data clock signal $\overline{C_D}$ and the data clock signal $C_D$ at a logic "0" and a logic "1", respectively, the transmission gate 24 will not be passing the data signal D into the flip-flop. Likewise, with the inverse scan clock signal $\overline{C_S}$ and the scan clock signal $C_S$ at a logic "0" and a logic "1", respectively, the transmission gate 26 will not be passing the scan input signal SI into the flip-flop. However, the inverse feedback clock signal $\overline{C_F}$ and the feedback clock signal $C_F$ will be oscillating with the inverse clock signal $\overline{C}$ and the clock signal C, respectively, albeit with some latency delay caused by the selection circuit 16. When the inverse feedback clock signal $\overline{C_F}$ is at a high voltage, or logic "1", and the feedback clock signal $C_F$ is at a low voltage, or logic "0", transmission gate 22 passes the output/feedback signal Q/FB to the first node NODE1, or in other words, into the flip-flop.

Once the transmission gate 22 passes this signal, inverter 28 inverts the signal, which is applied to an input of clock gating inverter 30. When the clock signals $\overline{C}$, C, $\overline{C_F}$, and $C_F$ transition state, transmission gate 22 does not pass the output/feedback signal Q/FB, but the clock gating inverter 30 inverts the signal output from the inverter 28, effectively restoring the output/feedback signal Q/FB at the first node NODE1. The inverter 28 inverts this signal, which is passed by transmission gate 32 to the inverter 34. The inverter 34 inverts the signal, which is output as the output/feedback signal Q/FB and which is input into clock gating inverter 36. When the clock signals $\overline{C}$, C, $\overline{C_F}$, and $C_F$ transition state, transmission gate 32 stops passing any signal, and the clock gating inverter 36 inverts the output/feedback signal Q/FB, which is input into the inverter 34. The inverter 34 again inverts the signal and outputs the output/feedback signal Q/FB. During this clock state, the transmission gate 22 again passes the output/feedback signal Q/FB, and the processes in this operation begin to cycle again.

A second operation is when the scan enable signal SE is at a low voltage, or logic "0", and the enable signal E is at a high voltage, or a logic "1". In this state, the output of the AND gate 58 is a high voltage, or a logic "1". The outputs of the inverter 54 and the AND gate 56 are both a low voltage, or a logic "0". With these outputs input into the clock control multiplexers 40, 42, and 44, both the clock control multiplexers 42 and 44 output a low voltage, or logic "0", as the inverse scan clock signal $\overline{C_S}$ and the inverse feedback clock signal $\overline{C_F}$, respectively. Thus, the scan clock signal $C_S$ and the feedback clock signal $C_F$ are both at a high voltage, or a logic "1". However, with the logic "1" output from the AND gate 58 and input into the control input of clock control multiplexer 40, the clock control multiplexer 40 outputs the inverse clock signal C as the inverse data clock signal $\overline{C_D}$, and thus, the data clock signal $C_D$ is the clock signal C.

These clock signals are then input into the control inputs of transmission gates in the data path 20. With the inverse scan clock signal $\overline{C_S}$ and the scan clock signal $C_S$ at a logic "0" and a logic "1", respectively, the transmission gate 26 will not be passing the scan input signal SI into the flip-flop. Likewise, with the inverse feedback clock signal $\overline{C_F}$ and the feedback clock signal $C_F$ at a logic "0" and a logic "1", respectively, the transmission gate 22 will not be passing the output/feedback signal Q/FB into the flip-flop. However, the inverse data clock signal $\overline{C_D}$ and the data clock signal $C_D$ will be oscillating with the inverse clock signal $\overline{C}$ and the clock signal C, respectively, albeit with some latency delay caused by the selection circuit 16. When the inverse data clock signal $\overline{C_D}$ is at a high voltage, or logic "1", and the data clock signal $C_D$ is at a low voltage, or logic "0", transmission gate 24 passes the data signal D to the first node NODE1, or in other words, into the flip-flop.

Once the transmission gate 24 passes this signal, inverter 28 inverts the signal, which is applied to an input of clock gating inverter 30. When the clock signals $\overline{C}$, C, $\overline{C_D}$, and $C_D$ transition state, transmission gate 24 does not pass the data signal D, but the clock gating inverter 30 inverts the signal output from the inverter 28, effectively restoring the data signal D at the first node NODE1. The inverter 28 inverts this signal, which is passed by transmission gate 32 to the inverter 34. The inverter 34 inverts the signal, which is output as the output/feedback signal Q/FB and which is input into clock gating inverter 36. When the clock signals $\overline{C}$, C, $\overline{C_D}$, and $C_D$ transition state, transmission gate 32 stops passing any signal, and the clock gating inverter 36 inverts the output/feedback signal Q/FB, which is input into the inverter 34. The inverter 34 again inverts the signal and outputs the output/feedback signal Q/FB. During this clock state, the transmission gate 24 again passes the data signal D, and the processes in this operation begin to cycle again.

A third operation is when the scan enable signal SE is at a high voltage, or logic "1", regardless of the voltage level of the enable signal E. In this state, the output of the inverter 54 is a high voltage, or a logic "1". The outputs of the AND gates 56 and 58 are both a low voltage, or a logic "0". With these outputs input into the clock control multiplexers 40, 42, and 44, both the clock control multiplexers 40 and 44 output a low voltage, or logic "0", as the inverse data clock signal $\overline{C_D}$ and the inverse feedback clock signal $\overline{C_F}$, respectively. Thus, the data clock signal $C_D$ and the feedback clock signal $C_F$ are both at a high voltage, or a logic "1". However, with the logic "1" output from the inverter 54 and input into the control input of clock control multiplexer 42, the clock control multiplexer 42 outputs the inverse clock signal $\overline{C}$ as the inverse scan clock signal $\overline{C_S}$, and thus, the scan clock signal $C_S$ is the clock signal C.

These clock signals are then input into the control inputs of transmission gates in the data path 20. With the inverse feedback clock signal $\overline{C_F}$ and the feedback clock signal $C_F$ at a logic "0" and a logic "1", respectively, the transmission gate 22 will not be passing the output/feedback signal Q/FB into the flip-flop. Likewise, with the inverse data clock signal $\overline{C_D}$ and the data clock signal $C_D$ at a logic "0" and a logic "1", respectively, the transmission gate 24 will not be passing the data signal D into the flip-flop. However, the inverse scan clock signal $\overline{C_S}$ and the scan clock signal $C_S$ will be oscillating with the inverse clock signal $\overline{C}$ and the clock signal C, respectively, albeit with some latency delay caused by the selection circuit 16. When the inverse scan clock signal $\overline{C_S}$ is at a high voltage, or logic "1", and the scan clock signal $C_S$ is at a low voltage, or logic "0", transmission gate 26 passes the scan input signal SI to the first node NODE1, or in other words, into the flip-flop.

Once the transmission gate 26 passes this signal, inverter 28 inverts the signal, which is applied to an input of clock gating inverter 30. When the clock signals $\overline{C}$, C, $\overline{C_S}$, and $C_S$ transition state, transmission gate 26 does not pass the scan input signal SI, but the clock gating inverter 30 inverts the signal output from the inverter 28, effectively restoring the scan input signal SI at the first node NODE1. The inverter 28 inverts this signal, which is passed by transmission gate 32 to the inverter 34. The inverter 34 inverts the signal, which is output as the output/feedback signal Q/FB and which is input into clock gating inverter 36. When the clock signals $\overline{C}$, C, $\overline{C_S}$, and $C_S$ transition state, transmission gate 32 stops passing any signal, and the clock gating inverter 36 inverts the output/feedback signal Q/FB, which is input into the inverter 34. The inverter 34 again inverts the signal and outputs the output/feedback signal Q/FB. During this clock state, the transmission gate 26 again passes the scan input signal SI, and the processes in this operation begin to cycle again.

Figure 3:
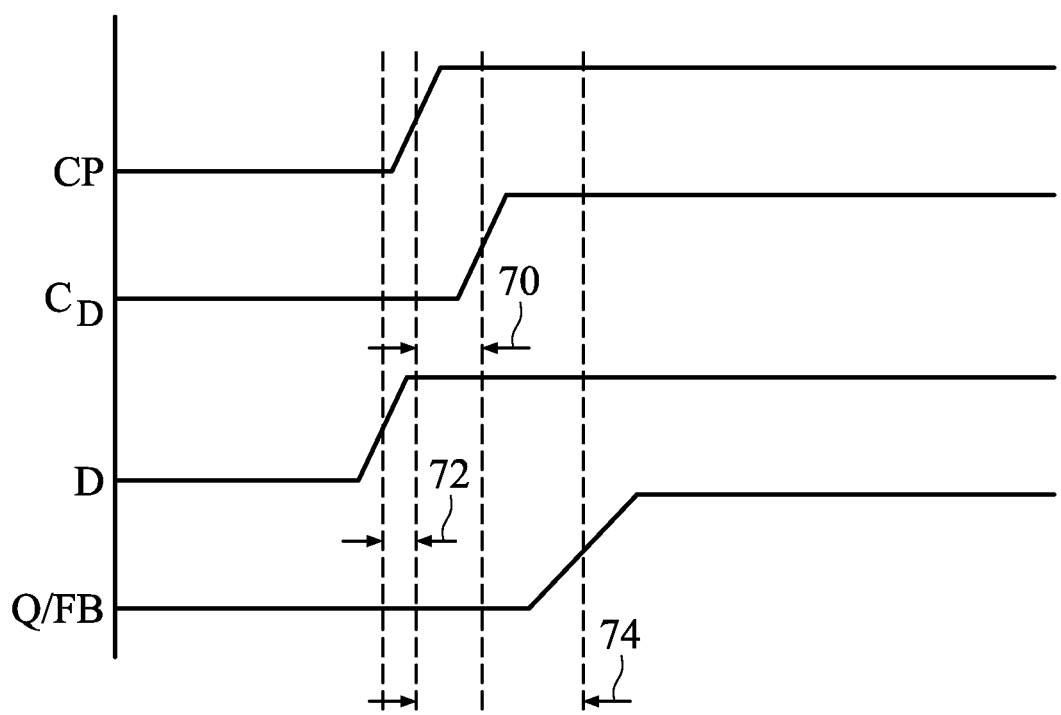
FIG. 3 is an exemplary timing graph of an embodiment.

FIG. 3 illustrates an exemplary timing graph of the system in FIGS. 1A, 1B, and 2. The graph shows the input clock signal CP, the data clock signal $C_D$, the data signal D, and the output/feedback signal Q/FB. Arrows 70 indicate the delay between the input clock signal CP and the data clock signal $C_D$ caused by the selection logic 16. Arrows 72 show the requisite set-up time for a transitioning data signal D, as measured from the rising edge of the input clock signal CP. The set-up time may be greatly decreased by the embodiments discussed above because the selection logic is not on the data path 20 but is on the clock path 10. The inventors have discovered that the set-up time for both a rising edge and a falling edge of a data signal D is decreased by having the selection logic in the clock path 10 as opposed to the data path 20. Thus, this embodiment realizes an advantage over the prior art. However, with this embodiment, the CP-Q delay remains unaffected as does the delay between the input clock CP and the output/feedback signal Q/FB, as indicated by arrows 74. This is because the flip-flop circuit continues to be operated with the clock signal C and the inverse clock signal C that does not go through the selection logic.

Although an embodiment and its advantages have been described in detail, it should be understood that various changes, substitutions and alterations can be made herein without departing from the spirit and scope as defined by the appended claims. For example, many of the circuit elements may be changed or modified while having the same functionality, for example the pass gates may be some combination of AND gates, NOR gates, or inverters, and the selection logic circuit may be some other combination of logic circuits. Also, the logic levels may be changed without departing for the scope, such as switching the logic states from high logic to low logic, and vice versa.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An integrated circuit comprising:
a master-slave flip-flop;
a selection logic circuit comprising first combinational logic circuitry and second combinational logic circuitry, the first combinational logic circuitry configured to selectively enable one or more of at least three clock signals in response to a control signal determined by the second combinational logic circuitry and selectively disable two or more of the at least three clock signals that were not enabled, the second combinational logic circuitry having a first enable signal input and a second enable signal input, the control signal being determined in response to the first enable signal and the second enable signal; and
a pass structure configured to pass one of at least three data signals to the master-slave flip-flop in response to the one or more of the at least three clock signals being enabled, wherein two of the at least three data signals are not passed.

2. The integrated circuit of claim 1, wherein the master-slave flip-flop comprises a set function, a clear function, or combinations thereof.

3. The integrated circuit of claim 1, wherein the at least three data signals comprise an input data signal, a feedback signal, and a scan input signal, and wherein the at least three clock signals comprise an input data clock signal, a feedback clock signal, and a scan input clock signal.

4. The integrated circuit of claim 1, wherein the selection logic circuit is configured to output respective one or more inverted clock signal that is an inverted representation of the enabled one or more of the at least three clock signals.

5. The integrated circuit of claim 1, wherein the first combinational logic circuitry comprises at least three multiplexers, each of the at least three multiplexers having a disabling signal input and a representation of a master clock signal input, the second combinational logic circuitry outputting respective multiplexer controls to the at least three multiplexers in response to the first enable signal input and the second enable signal input, wherein each of the at least three multiplexers outputs either the disabling signal or the representation of the master clock in response to the respective multiplexer controls, wherein by outputting the disabling signal or the representation of the master clock, each multiplexer is disabling or enabling, respectively, the one or more of the at least three clock signals.

6. The integrated circuit of claim 1, wherein the pass structure comprises a transmission gate, wherein the enabled one or more of the at least three clock signals is input into a first control input of the transmission gate, and an inverse of the enabled one or more of the at least three clock signals is input into a second control input of the transmission gate, wherein the transmission gate passes the data signal during at least a portion of a clock cycle.

7. An integrated circuit comprising:
selection logic circuit comprising a first combinational logic circuit and a second combinational logic circuit, the first combinational logic circuit being in a clock path, the second combinational logic circuit not being in the clock path, the first combinational logic circuit being operable to receive a clock signal and an intermediate control signal, and being operable to selectively output an enabled clock signal, a first disabled clock signal, and a second disabled clock signal in response to the intermediate control signal, the second combinational logic circuit being operable to output the intermediate control signal based on a first control signal; and
a pass structure in a data path, wherein the pass structure is operable to selectively pass a first data signal, a second data signal, or a third data signal in response to the enabled clock signal, the first disabled clock signal, and the second disabled clock signal.

8. The integrated circuit of claim 7, further comprising a master-slave flip-flop electrically coupled to the pass structure, wherein the pass structure is operable to selectively pass the first data signal, the second data signal, or the third data signal to the master-slave flip-flop.

9. The integrated circuit of claim 7, wherein the enabled clock signal comprises an inverted clock signal and a non-inverted clock signal.

10. The integrated circuit of claim 7, wherein the pass structure comprises a first transmission gate, a second transmission gate, and a third transmission gate, wherein each of the first transmission gate, the second transmission gate, and the third transmission gate has as a pass control input one of the enabled clock signal, the first disabled clock signal, and the second disabled clock signal.

11. The integrated circuit of claim 7, wherein the second combinational logic circuit comprises a decode logic circuit, and the first combinational logic circuit comprises a multiplexer, wherein the first control signal is input into the decode logic circuit, wherein an output of the decode logic circuit includes the intermediate control signal, the intermediate control signal being input into the multiplexer as a multiplexer control, and wherein the multiplexer selectively outputs either the enabled clock signal, the first disabled clock signal, or the second disabled clock signal in response to the multiplexer control.

12. A method of operating an integrated circuit, the method comprising:
receiving a first control signal and a second control signal at a first combinational logic circuit;
outputting an intermediate signal from the first combinational logic circuit, the intermediate signal being based on the first control signal and the second control signal;
selectively enabling one or more of at least three clock signals by a second combination logic circuit in response to the intermediate signal and selectively disabling another of the at least three clock signals;
passing one of at least three data signals in response to a selected clock signal being enabled, wherein another of the at least three data signals is not passed when the other of the at least three clock signals is disabled; and
storing the one of the at least three data signals that is passed.

13. The method of claim 12, wherein the step of storing the one of the at least three data signals includes storing in a master-slave flip-flop.

14. The method of claim 12, wherein the step of outputting the intermediate signal comprises decoding the control signal at the first combinational logic to determine the intermediate signal, the intermediate signal including a multiplexor control, and wherein the step of selectively enabling comprises outputting the enabled one or more of the at least three clock signals in response to the multiplexer control.

15. The method of claim 12, wherein the step of passing the one of at least three data signals comprises:
inputting the enabled one or more of the at least three clock signals into a control input of a transmission gate; and
passing the one of at least three data signals through the transmission gate in response to the enabled one or more of the at least three clock signals.

16. The method of claim 12, wherein the at least three data signals comprise a feedback signal, an input data signal, and a scan input signal.

17. The method of claim 12, further comprising outputting the stored one of the at least three data signals.

* * * * *